(12) United States Patent
Allpress et al.

(10) Patent No.: US 8,793,561 B2
(45) Date of Patent: Jul. 29, 2014

(54) ITERATIVE DECODING OF SIGNALS RECEIVED OVER A NOISY CHANNEL USING FORWARD AND BACKWARD RECURSIONS WITH WARM-UP INITIALIZATION

(75) Inventors: Steve Allpress, Bristol (GB); Colman Hegarty, Bristol (GB); Fabienne Hegarty, legal representative, Bristol (GB); Carlo Luschi, Oxford (GB)

(73) Assignee: Icera Inc., Wilmington, DE (US)

( * ) Notice: Subject to any disclaimer, the term of this patent is extended or adjusted under 35 U.S.C. 154(b) by 233 days.

(21) Appl. No.: 13/393,022

(22) PCT Filed: Aug. 26, 2010

(86) PCT No.: PCT/EP2010/062515
§ 371 (c)(1),
(2), (4) Date: Feb. 28, 2012

(87) PCT Pub. No.: WO2011/023782
PCT Pub. Date: Mar. 3, 2011

(65) Prior Publication Data
US 2012/0192028 A1 Jul. 26, 2012

(30) Foreign Application Priority Data
Aug. 28, 2009 (GB) .................................. 0915135.8

(51) Int. Cl.
*H03M 13/00* (2006.01)
*H04L 1/00* (2006.01)
*H03M 13/05* (2006.01)
*H03M 13/29* (2006.01)
*H03M 13/37* (2006.01)
*H03M 13/39* (2006.01)
*G06F 11/10* (2006.01)

(52) U.S. Cl.
CPC ................ *H04L 1/005* (2013.01); *G06F 11/10* (2013.01); *H03M 13/05* (2013.01); *H03M 13/2957* (2013.01); *H03M 13/3723* (2013.01); *H03M 13/3905* (2013.01); *H03M 13/3972* (2013.01); *H03M 13/6362* (2013.01); *H03M 13/653* (2013.01); *H04L 1/0055* (2013.01); *H04L 1/0066* (2013.01); *H04L 1/0068* (2013.01)
USPC .......................................... 714/796; 714/780

(58) Field of Classification Search
None
See application file for complete search history.

(56) References Cited

U.S. PATENT DOCUMENTS 6,563,877 B1 * 5/2003 Abbaszadeh .................. 375/242
6,671,852 B1 * 12/2003 Ariel et al. ..................... 714/793

(Continued)

FOREIGN PATENT DOCUMENTS

EP       1677423 A1   7/2006
GB       2365290 A    2/2001

(Continued)

*Primary Examiner* — Daniel McMahon

(57) ABSTRACT

One aspect provides a method. The method comprises receiving a signal comprising a sequence of encoded symbols, each corresponding to one of a plurality of possible states. For each symbol in the sequence, the method further comprises determining a set of state metrics, each representing a probability that the respective symbol corresponds to the plurality of states. The method further comprises decoding the signal by processing runs of recursions using runs of forward recursions, whereby a later state metric in the sequence is updated based on a preceding state metric, and runs of recursions using runs of reverse recursions, whereby a preceding state metric in the sequence is updated based on a later state metric. The method further comprises outputting the decoded signal to a device. The decoding comprises performing a plurality of repeated iterations over the sequence.

16 Claims, 8 Drawing Sheets

(56) References Cited

U.S. PATENT DOCUMENTS

| | | | |
|---|---|---|---|
| 6,829,313 B1 * | 12/2004 | Xu | 375/341 |
| 6,856,657 B1 * | 2/2005 | Classon et al. | 375/341 |
| 6,868,132 B1 * | 3/2005 | Classon et al. | 375/341 |
| 6,901,117 B1 * | 5/2005 | Classon et al. | 375/341 |
| 6,957,376 B2 * | 10/2005 | Becker et al. | 714/755 |
| 7,647,547 B2 * | 1/2010 | Garrett et al. | 714/796 |
| 7,757,151 B2 * | 7/2010 | Xu | 714/755 |
| 2001/0044919 A1 | 11/2001 | Edmonston et al. | |
| 2002/0118776 A1 | 8/2002 | Blankenship et al. | |
| 2003/0097630 A1 | 5/2003 | Wolf et al. | |
| 2005/0091566 A1 * | 4/2005 | Berens et al. | 714/755 |
| 2007/0055919 A1 * | 3/2007 | Li et al. | 714/755 |
| 2007/0113144 A1 * | 5/2007 | Li | 714/755 |

FOREIGN PATENT DOCUMENTS

| | | |
|---|---|---|
| WO | WO2008051152 A2 | 5/2008 |
| WO | PCTEP2010062515 | 12/2010 |

* cited by examiner

ITERATIVE DECODING OF SIGNALS RECEIVED OVER A NOISY CHANNEL USING FORWARD AND BACKWARD RECURSIONS WITH WARM-UP INITIALIZATION

FIELD OF THE INVENTION

The present invention relates to decoders such as the enhanced implementation of maximum a posteriori probability (MAP) soft-input/soft-output (SISO) windowed decoders, which may be applied in Turbo decoders or such like. Particularly but not exclusively, the present invention has an application for enhancing the performance of windowed Turbo decoders designed for the High Speed Packet Access (HSPA) and High Speed Packet Access Plus (HSPA+) modes of the Third Generation Partnership Project (3GPP) Wideband Code Division Multiple Access (WCDMA) mobile telecommunications standard.

BACKGROUND

The Turbo Code is an error correcting code (ECC) commonly used in wireless communications systems, one example being in the physical layer of the 3GPP standards for wireless cellular communications. Turbo codes are chosen due to their robustness, efficiency and relative ease of implementation. Reference may be made to the following.

[Reference 1] "Near Shannon Limit Error-Correcting Coding and Decoding: Turbo-Codes" by: C. Berrou, A. Glavieux, P. Thitimajshima. Communications, 1993. ICC 93. Geneva. Technical Program, Conference Record, IEEE International Conference on, Vol. 2 (1993), pp. 1064-1070 vol. 2.

[Reference 2] 3GPP TS 25.212 (Multiplexing and channel coding) section 4.2.3.2 (Turbo Coding) and 4.2.7 (rate matching).

[Reference 3] Turbo-coding and puncturing interactions on HS-DSCH in R5 HSDPA. Document #R1-030444 for discussion at 3GPP TSG-RAN Working Group 1 Meeting #32, Paris, France May 19-23 2003.

[Reference 4] An intuitive justification and a simplified implementation of the MAP decoder for convolutional codes. by A. J. Viterbi. IEEE J. Sel. Areas Commun., vol. 16, no. 2, pp. 260-264, February 1998.

[Reference 5] Optimal Decoding of Linear Codes for Minimizing Symbol Error Rate. by L. R. Bahl, J. Cocke, F. Jelinek, J. Raviv. *IEEE Transactions on Information Theory*, IT-20, pp. 284-287, March 1974.

[Reference 6] U.S. Pat. No. 5,933,462: "Soft decision output decoder for decoding convolutionally encoded codewords", Andrew J. Viterbi et al

[Reference 7] US patent application publication no. 2006/0067229: "Transmitting data in a wireless network", Frank Frederiksen.

The operation of a Turbo code is based on the parallel or serial concatenation of two component codes separated by an interleaver. The component codes can be systematic or non-systematic, depending on the presence of the input information bits in the encoded output stream. The following description refers to the case of a parallel concatenation of systematic convolutional codes.

A Turbo Code works by redundantly encoding two differently ordered (interleaved) copies of the data to be sent. Some information (not necessarily all) from both encoders is then transmitted over a noisy channel. FIG. 1 schematically illustrates a transmitter 100 comprising a Turbo encoder 102 and associated puncturing module 108. The Turbo encoder 102 comprises a first constituent encoder 104a, a second constituent encoder 104b, and an interleaver 106 with its output coupled to the input of the second constituent encoder 104b.

The first constituent encoder 104a forms a first branch arranged in parallel with a second branch formed of the second constituent encoder 104b and its associated interleaver 106, such that the inputs of the first constituent encoder 104a and of the interleaver 106 are each arranged to receive the same input data S. This input data S comprises the information bits, i.e. the actual data desired to be transmitted. The input data S is preferably supplied inf "systematic" form, which means it either is or contains the actual data bits in an explicit or verbatim form. Preferably, it may directly contain the actual data bits plus additional check-sum bits e.g., in the presence of a cyclic redundancy check (CRC) code.

The interleaver 106 re-orders the systematic input data S and supplies the re-ordered systematic data to the input of the second constituent encoder 104b. Thus the second constituent encoder 104b encodes a differently ordered version of the same data S as encoded by the first constituent encoder 104a. The constituent encoders 104a and 104b are preferably convolutional encoders which output parity bits for use in error correction at the decoder 115 (discussed shortly). The first constituent encoder 104a outputs non-interleaved parity bits $P_n$ and the second constituent encoder outputs interleaved parity bits $P_i$. The parity bits add are redundant bits added in order to improve error correction at the decoder 115 (N.B. these redundant parity bits are in addition to the check-sum bits optionally introduced by a CRC—the CRC code and turbo codes are separate entities).

The systematic data bits $S_k$ and parity bits $P_{nk}$ and $P_{ik}$ (where the integer k is the information bit index=1, 2, 3, etc.) are then transmitted in a sequence such as:

$S_1, P_{n1}, P_{i1}, S_2, P_{n2}, P_{i2}, S_3, P_{n3}, P_{i3}, \ldots$ etc.

Each combination of $S_m, P_m, P_m$ for a given bit index m forms a symbol related to the uncoded information bit at index k. So in this example, three bits are transmitted to represent every one actual information bit, giving a coding rate of R=⅓.

The output of each of the constituent encoders 104a and 104b may then be coupled to a puncturing module 108 in order to "puncture" the parity bits $P_n$ and $P_i$ before transmission. This means certain ones of the parity bits are removed, thus varying the ratio of redundant information to actual information, i.e. variably increasing the coding rate R. Puncturing will be discussed in more detail later.

The systematic data S and parity bits $P_n$ and $P_i$ are transmitted over a noisy channel 110 to a receiver 101, typically wirelessly, e.g. over a wireless cellular network. The noise may represent any disturbance due to the process of transmitting the signal over the wireless propagation channel and from the conceptual operation and implementation of the communication receiver 101—so it may be due for example to any or all of: the modulation process; other transmission (Tx) processes or components; the air interface itself; or the equalisation, demodulation or log-likelihood ratio estimation processes at the receiver 101; or other processes or components of the receiver 101. Therefore all of the data S, $P_n$ and $R_i$ as received at the decoder 115 are not likely to be exactly as output by the encoder 102: the received data will contain errors, and so an error-correcting decoding process such as Turbo decoding is required.

The Turbo decoding process in the receiver 101 is an iterative process whereby each copy of the received data is decoded in alternating turns by a soft-inputsoft-output (SISO) decoder. At each Turbo decoder iteration some "soft" information concerning the likely value of the original data is passed on as the "extrinsic" input to the next iteration. After a number of such Turbo iterations, the soft information is converted into a "hard" decision. In the presence of a CRC code, a checksum is then performed on the decoded data to verify that all errors were corrected successfully.

An example receiver 101 is illustrated schematically in FIG. 1. The receiver 101 comprises a front-end 116 which samples each of the received systematic data bits S and parity bits $P_n$ and P. However, since these are to be used in a soft decoder, the front-end does not simply sample the received bits as definite logic-ones and logic-zeros. Instead, for each received bit S, $P_n$ or $P_i$, it samples a measurement representing the ratio of the probability that the received bit was transmitted as a logic-one to the probability that the received bit was transmitted as a logic-zero. The calculation of the probability ratio as a function of input sampled in-phase/quadrature signal amplitudes is dependent on the modulation scheme used (e.g. 16-QAM, 64-QAM etc.) and the estimated channel noise variance. E.g. if this soft measurement was represented by an eight-bit variable then it could take any value between −127 meaning "very likely logic-zero", to 0 meaning "equally likely logic-one or logic-zero", to +127 meaning "very likely logic-one". These "soft" values are referred to as likelihood ratios. In fact these are typically expressed as log likelihood ratios, so mathematically S=ln(Prob(bit=1)/Prob(bit=0)). When the bit is equally likely to be one or zero, Prob(bit=1)=Prob(bit=0)=>S=ln(1)=0. The use of logs simplifies the decoder since multiplication may be replaced by addition of logs.

The receiver 101 further comprises an interleaver 114 with an input arranged to receive the received systematic data S, and a de-puncturing module 112 with an input arranged to receive the received parity data $P_n$ and $P_i$. For the case of parallel concatenated turbo code, the received systematic data S is split into two parallel branches, one of which is interleaved by the interleaver 114 in a corresponding manner to the interleaver 106 which was applied at the transmitter 100. Thus a series of non-interleaved bit log likelihood ratios $S_n$ and interleaved bit log likelihood ratios $S_i$ are determined at the receiver. The de-puncturing module 112 re-inserts the pattern of any parity bits $P_n$ and/or $P_i$ that were removed by the puncturing module 108 at the transmitter 100. Since the information on the parity bits is not available at the receiver, the positions corresponding to the parity bits are filled with log likelihood ratios representing "equally likely logic-one or logic-zero".

The receiver further comprises a Turbo decoder 115, which comprises a first SISO constituent decoder 117a, a further interleaver 119, a second constituent SISO decoder 117b, a de-interleaver 123, and a hard-decision module 125. The first SISO decoder 117a has one input coupled to the front-end and thus arranged to receive the non-interleaved systematic bit log likelihood ratios $S_n$, another input coupled to an output of the de-puncturing module 112 and thus arranged to receive the non-interleaved parity bit log likelihood ratios $P_n$, and another input coupled in a iterative feedback loop to the output of the de-interleaver 123. The output of the first SISO decoder 117a is coupled to the input of the further interleaver 119. The second SISO decoder 117b has an input coupled to the output of the interleaver 114 and thus arranged to receive the interleaved systematic bit log likelihood ratios $S_i$, another input coupled to an output of the de-puncturing module 112 and thus arranged to receive the interleaved parity bit log likelihood ratios $P_i$, and another input coupled to the output of the further interleaver 119. The output of the second SISO decoder 117b is coupled to the input of the de-interleaver 123. The output of the de-interleaver 123 is coupled back to the input of the first SISO decoder 117a, and also coupled on to the input of the hard-decision module 125. The output of the hard decision module 125 is arranged to supply the hard output of the decoder 115.

In operation, the first SISO decoder 117a performs a soft decoding process based on the non-interleaved systematic and parity bits $S_n$ and $P_n$ (and input extrinsic Ein—see below); thus outputting a soft decision $E_{out}$ for each decoded bit. The soft decision $E_{out}$ is typically expressed as an "extrinsic" value. Note the distinction between "extrinsic" values Eout/Ein and log likelihood ratios. The extrinsics Eout/Ein passed between the component decoders are not true log likelihood ratios. In fact for decoder 117a in the log domain the extrinsic Eout=LLRout−(Sn+Ein), where LLRout is the output log likelihood ratio from each decoder. Intuitively the extrinsic measures the contribution to each decoder's log likelihood ratio estimate from the parity information available only to that decoder. Typically only that information is passed between decoders during the iterative decoding process. The extrinsic is also referred to in the literature as "a priori" probability information for each decoder while the LLR is the complete "a posteriori" probability.

The further interleaver 119 then interleaves the data $E_{out}$ output by the first SISO decoder 117a in a corresponding manner to the interleaver 106 which was applied at the transmitter 100 and other interleaver 114 applied at the receiver 101, in order to supply the input extrinsic $E_{in}$ to the second SISO decoder 117b. The second SISO decoder 117b then performs a soft decoding process on the interleaved data based on the interleaved systematic and parity bits $S_i$ and $P_i$ (and input extrinsic Ein), and thus outputs another soft-decision (output extrinsic) $E_{out}$ for each decoded bit. The de-interleaver 123 then reverses the interleaving applied by the further interleaver 119, and the de-interleaved soft data output by the de-interleaver 123 is fed back as the input extrinsic $E_{in}$ to the input of the first SISO decoder 117a to undergo one or more further Turbo decoder iterations, by repeating the process outlined in this paragraph.

Once a sufficient or predetermined number of Turbo iterations have been completed, the de-interleaved soft data output by the de-interleaver 123 is supplied to the input of the hard-decision making module 125, which converts the soft extrinsics into definite binary values of either logic-one or logic-zero, depending on which is finally determined to be more likely. That is, on the final iteration, the true log-likelihood ratio information from the final SISO decoding (LLRout not Eout) is passed to the de-interleaver 123 and hard-decision process 125. Hence $LLR_{out}$ is shown in FIG. 1 as an additional output from the second SISO decoder 117b.

The decoding of both interleaved and non-interleaved versions of the data, and the multiple iterations, improves the reliability of the decoded data.

Turning to the details of the constituent encoders 104a and 104b, the constituent encoding algorithm can in principal be any error correcting code for which a SISO decoder can be built. However, the Turbo algorithm 102, 115 just described is so effective that in most cases, a small, short constraint length recursive, convolutional encoder is usually used. This makes SISO decoding relatively inexpensive—which is very important since the Turbo decoding algorithm can require several SISO decoder iterations.

The constituent encoder is often a recursive systematic convolutional encoder with just 8 possible states (or sometimes 16). A schematic illustration of an 8-state convolutional encoder is illustrated schematically at the top of FIG. 2. A respective instance of this could be used to implement each of the constituent encoders 104a and 104b. The convolutional encoder comprises a shift register comprising three sequential 1-bit data elements D, and a plurality of modulo-2 adders (+), with the arrowed lines in FIG. 2 showing coupling and direction of data flow. Since there are three data elements D, each constituent encoder 104a or 104b can at any one time take one of only $2^3=8$ possible states.

The adders (+) are exclusive-OR (XOR) gates (such that 0+0=0, 0+1=1, 1+0=1, and 1+1=0). The input systematic data S is input through the left-most XOR gate in FIG. 2 and then shifted through the data elements D of the shift register, with the other input of the left-most XOR gate being the XOR of the two right-most data elements D. Thus each successive state is dependent on the input data S and the preceding state of the shift register. Since the data elements D are connected in the form of a shift register and fed in this manner from input S, then the bits in data elements D cannot transition arbitrarily from one state to another. Instead, only certain state transitions are possible (and the XOR circuitry maps a symbol S,P onto each of the state transitions). This is illustrated schematically at the bottom of FIG. 2, which is a portion of "trellis diagram" showing some allowed transitions (with the right-hand data element corresponding to the most significant bit). For example, state 000 will remain at 000 if the next input bit S is a 0, or will transition to 001 if the next input bit is 1. However, a transition from 000 to any other state, e.g. 101, is impossible. As another example, state 001 will transition to state 010 if the next input bit S is a 0, or will transition to state 011 if the next input bit S is a 1. However, a transition from 001 to any other state, e.g. 110 or 000, is impossible. Thus only certain "paths" through the trellis diagram are possible.

A "trellis" decoder uses this fact to provide error correction at the receiver. Each SISO decoder 117a and 117b comprises a respective instance of such a trellis decoder. In the trellis decoder, a "state-metric" represents the probability of each of the 8 possible states for each transition between symbols of the encoded data received. That is, for each received symbol transition, the trellis decoder 117a or 117b determines the probability that the respective encoder 104a or 104b transitioned to each of the 8 possible states after it transmitted the symbol in question (so each symbol corresponds to a set of 8 state metrics). This works on the basis that an erroneous symbol S,P (corrupted by noise) will result in a deviation from an allowed path through the trellis diagram. By analysing possible solutions, the probabilities of the 8 different possible states for each symbol can be determined.

For a maximum a posteriori probability (MAP) decoder, the decoding process operates by performing a run of trellis iterations over a sequence (e.g. a block) of received symbols and their corresponding sets of state-metrics, updating each successive state-metric in the received sequence based on: the preceding state-metrics in the sequence; the received symbol values; and, implicitly, knowledge of the encoding rule used. With each trellis iteration, the aim is for the state metrics of the respective set to diverge such that one emerges as more likely than the others (i.e. diverge within a given set). In decoders such as Turbo decoders, the whole run may be repeated again one or more times across the sequence to try to get the log likelihood ratios to diverge further to a more definite, reliable solution. That is, each Turbo decoder iteration comprises a whole sweep of trellis iterations over the received block or sequence, whereas an individual trellis iteration is an iteration between two adjacent sets of state-metrics. To distinguish between the overall Turbo iterations and their individual component trellis iterations or such like, an individual iteration between sets of state metrics such as a trellis iteration may be referred to as a "recursion". For a mathematical description of this process, see the above References 1-7.

A MAP trellis decoder can also be made to accept the received symbols in the reverse order to which they were originally encoded since the previous and next states of the constituent encoder can be derived easily from one another. By running the trellis decoder in both directions the resulting "forward" and "backward" state-metrics can be combined to create a better soft-likelihood estimate of the original symbol values.

On a point of terminology, note that to simplify the arithmetic operations in practical implementations of such a MAP decoder, the state-metrics are typically represented as the logarithms of probabilities while the received symbol values are typically represented as the logarithm of a ratio of the probability of a logic-one to the probability of a logic-zero (a.k.a. log-likelihood-ratio, or LLR).

$$LLR(S_k) = \log [P(S_k=1|r_k)/P(S_k=0|r_k)],$$

where $P(S_k=1|r_k)$ and $P(S_k=0|r_k)$ are the probability that $S_k$ corresponds to the logical value 1 given the received signal $r_k$, and the probability that $S_k$ corresponds to the logical value 0 given the received signal $r_k$, respectively. Soft extrinsics such as $E_{out}$ may also be represented in a logarithmic form, as discussed above. Hence the name "Log-MAP Decoder" for the type of SISO decoder discussed herein. Further arithmetic simplification can be obtained at the expense of some accuracy to yield the Max-Log-MAP Decoder.

Implementing the MAP SISO decoder requires a relatively large amount of memory since, in order to perform a calculation using both the forward and backward state-metrics for every symbol in the block of encoded data it is first necessary to calculate and store all of the backward state-metrics or all of the forward state-metrics. The remaining set of state-metrics can then be calculated and used immediately by combining them with the stored set.

FIG. 3 schematically illustrates a block of forward and backward trellis recursions (i.e. forward and backward trellis iterations), for an 8-state convolutional code. Each vertical line of dots in FIG. 3 represents a set of the 8 possible states, each set corresponding to a respective symbol in the received sequence. Each Turbo iteration then comprises a forward and reverse run of trellis recursions over the block (for each of the interleaved and non-interleaved versions of the data).

The memory must contain 8 state-metrics for every symbol in the block. If a larger "general purpose" memory is used, then it should be noted that 8 state-metrics must be loaded and stored for every symbol in the block for each MAP iteration.

To avoid this cost, Viterbi invented the windowed MAP decoder (see References 4 and 6 above). Viterbi made the significant observation that it is not necessary to start a trellis decoder at the very beginning or end of a block of symbols in order to obtain a similarly accurate set of state-metrics for a particular symbol somewhere in the middle of the block. Instead—it is possible to start "cold" at any point sufficiently distant from the point of interest with some arbitrary set of state-metrics. If the distance is sufficiently large, then the initial set of state-metric values is irrelevant by the time the trellis decoder arrives at the point of interest. Viterbi suggests that a distance of 32 for a 16-state constituent code is often more than sufficient, observing that this amounts to more than 6 constraint lengths.

The idea of windowing, with a window of length L, uses this observation in order to avoid storing more than one window length's worth of state-metrics, i.e., more than L sets of state metrics corresponding to the L trellis stages of the window. Instead, in order to calculate L sets of metrics it is necessary only to "warm-up" over a sufficient distance (without storing any state-metrics) prior to calculating and using the following L sets of state-metrics. This warm-up phase requires additional calculations (trellis iterations, or "recursions") and thus, in order to amortize the extra cost of these calculations, the duration of the warm-up phase should not greatly exceed the window size (for example, using a window size of 1 would remove the requirement for any memory but would require an inordinate number of warm-up recursions).

FIG. 4 provides a schematic illustration of a windowed Log-MAP decoding process for use in a trellis decoder such as 117a or 117b. Time increases vertically down the page. At step 1a, the decoder performs a run of L trellis recursions (i.e. trellis iterations) in the forwards direction for the first window beginning at index 0 within the block and running to index L-1, storing all of the corresponding L sets of 8 state-metrics (i.e. 8 by L state-metrics). At step 1b, the decoder performs W warm-up trellis recursions in the reverse direction, from index L+W-1 within the block backwards to index L. This provides a warmed-up starting set of state-metrics for starting reverse trellis recursions for the first window backwards from index L-1 to index 0. At step 2a, the decoder performs a run of L trellis recursions in the forwards direction for the second window continuing onwards from the recursions of first window, starting at index L and running to index 2L-1, and storing the corresponding next L sets of 8 state-metrics. At step 2b, the decoder performs W warm-up trellis recursions in the reverse direction, from index 2L+W-1 within the block to index 2L. This provides a warmed-up starting set of state-metrics for starting reverse trellis recursions for the second window backwards from index 2L-1 to index 2L. At step 2c, the decoder performs a run of L trellis recursions in the reverse direction for the first window, starting backwards from index L-1 running to index 0, beginning from the warmed up set of state-metrics as determined for the first window in step 1b, and storing the corresponding preceding L sets of 8 state-metrics. As a result of step 2c, a soft extrinsic value $E_{out}$ is output for each symbol in the first window, ready for a subsequent Turbo iterations or output to the hard decision module 125 if sufficient Turbo iterations have already been performed. The process goes on in this manner for the second, third, fourth window, etc. until the whole block has been covered. Each Turbo iteration comprises a whole pass or sweep of component trellis iterations—i.e. trellis recursions—over the block.

As long as the required warm-up phase duration is modest; the window size L can be made similarly small and independent of the block size; thus the memory for temporary state-metric storage can be small and built very locally to the trellis computation hardware—minimizing the infrastructure needed and the power consumed to access it.

It is advantageous to be able to vary the coding rate in order to adapt to different channel conditions. The coding rate 'R' is defined as the ratio between the number of input (uncoded) bits and the number of encoded bits. Typically, a turbo encoder will generate 1 or 2 parity bits from each of the two constituent encoders for each input systematic bit. So, for example the 3GPP standard turbo code has a rate of R=⅓ (with 1 parity-bit per constituent encoder per input bit).

While such a code may be necessary to provide a sufficient level of error correction under low signal to noise ratio (SNR) conditions, it is excessive and wasteful when channel conditions are better. In order to raise the code rate R under such conditions, then a technique called puncturing is used whereby a defined set of parity bits are removed (i.e. not transmitted). The MAP decoders in the receiver 101 cope with the missing parity bits by assigning them a log-likelihood-ratio of 0 (meaning "equally likely to be either a logic-one or a logic-zero"). For example see Reference 3.

In the 3GPP standard, this technique can be taken to extremes—with rates as high as R=0.97 (~64 out of 65 parity bits removed!)—and with turbo decoding still giving a significant advantage over not encoding the data at all.

Unfortunately, the windowing algorithm can perform very poorly under such conditions since Viterbi's thumb-rule of requiring several constraint lengths to warm-up assumes implicitly that no or limited puncturing has taken place.

It can be shown that for any trellis recursion where the parity bit LLR is equal to zero (punctured), then the state-metrics within a set cannot diverge from one another in value (and therefore cannot converge towards a solution). At best, they are merely re-ordered according to the sign of the systematic bit, even if the systematic bit LLR value is very large. At worst, a low received systematic bit LLR value can reduce the existing divergence.

A set of warm-up recurions normally begins with all state-metrics set to the same value (all states equally likely) in the hope that after some modest number of recursions, the state-metrics will have converged to the same values that they would have taken had iterations started from a known initial state at one end of the block ((this will generally mean that the state metrics as a group diverge from the initial common value, e.g. with sufficient parity bits and in the absence of errors one state metric should emerge as much larger than the others).

This can never happen if the parity bits are so heavily punctured that there are no un-punctured parity bits throughout the entire duration of a warm-up phase (the state-metrics will remain in their equal, initialized state throughout). This means that although the windowed MAP decoder has the great advantage of not requiring a large amount of temporary storage, it can perform poorly compared with an un-windowed decoder when puncturing is used to raise the code rate.

SUMMARY

According to one aspect of the present invention, there is provided a method comprising: receiving a signal comprising a sequence of encoded symbols, each corresponding to one of a plurality of possible states; for each symbol in the sequence, determining a set of state metrics each representing a probability that the respective symbol corresponds to each of said plurality of states; decoding the signal by processing runs of recursions, using runs of forward recursions whereby a later state metric in the sequence is updated based on a preceding state metric, and runs of reverse recursions whereby a preceding state metric in the sequence is updated based on a later state metric; and outputting the decoded signal to a device; wherein the decoding comprises performing a plurality of repeated iterations over the sequence, and for each iteration: dividing the sequence into a plurality of smaller windows, processing the windows using separate runs of recursions, and performing an associated warm-up run of recursions for each window; and wherein the decoding further comprises, for each repeated recursion: alternating the direction of the warm-up runs between forward and reverse with each successive iteration over the sequence, storing one of the sets of state metrics from each window, and initialising the warm-up run of each window using a corresponding stored set of state metrics from a previous iterations.

In embodiments, the sequence of received symbols may comprise a variable amount of unavailable redundant information, and the method may comprise re-introducing bits in place of the unavailable redundant information.

The processing of each window may comprises both a forward and reverse run of recursions.

The decoding may further comprise alternating a direction of processing each successive iteration over the sequence, so as in one direction to process the sequence window-by-window from start to end of the sequence, and in the other direction to process the sequence window-by-window from end to start.

The direction in which the runs of recursions between adjacent windows are continuous may alternate with each successive iteration over the sequence, and may be opposite to the direction of the warm-up recursions.

All but the final window of the iteration may be of the same window length, and the sequence may comprise a block of a length that is not integer multiple of said window length, leaving a final window having a smaller remainder number of symbols; and the stored set of state metrics from each window may be taken from a position within each window equal to the remainder number of symbols into that window in the direction of processing the iteration.

The signal may be received over a wireless channel.

Each of said iterations may be a Turbo iteration, and each of said recursions may be a trellis iteration.

The decoding may be by maximum a posteriori probability decoding.

According to a further aspect of the present invention, there may be provided an apparatus comprising: a receiver arranged to receive a signal comprising a sequence of encoded symbols, each corresponding to one of a plurality of possible states; and a decoder configured to determine, for each symbol in the sequence, a set of state metrics each representing a probability that the respective symbol corresponds to each of said plurality of states; wherein the decoder is configured to decode the signal by processing runs of recursions, using runs of forward recursions whereby a later state metric in the sequence is updated based on a preceding state metric, and runs of reverse recursions whereby a preceding state metric in the sequence is updated based on a later state metric; and outputting the decoded signal to a device; wherein the decoder is configured to perform a plurality of repeated iterations over the sequence, and for each iteration: divide the sequence into a plurality of smaller windows, process the windows using separate runs of recursions, and perform an associated warm-up run of recursions for each window; and wherein the decoder is further configured to, for each repeated iteration: alternate the direction of the warm-up runs between forward and reverse with each successive iteration over the sequence, store one of the sets of state metrics from each window, and initialise the warm-up run of each window using a corresponding stored set of state metrics from a previous iteration.

According to another aspect of the present invention, there may be a provided a computer program product comprising code embodied on a computer-readable medium and configured so as when executed on a processor to: receive a signal comprising a sequence of encoded symbols, each corresponding to one of a plurality of possible states; for each symbol in the sequence, determine a set of state metrics each representing a probability that the respective symbol corresponds to each of said plurality of states; decode the signal by processing runs of recursions, using runs of forward recursions whereby a later state metric in the sequence is updated based on a preceding state metric, and runs of reverse recursions whereby a preceding state metric in the sequence is updated based on a later state metric; and outputting the decoded signal to a device; wherein the decoding comprises performing a plurality of repeated iterations over the sequence, and for each iteration: dividing the sequence into a plurality of smaller windows, processing the windows using separate runs of recursions, and performing an associated warm-up run of recursions for each window; and wherein the decoding further comprises, for each repeated iteration: alternating the direction of the warm-up runs between forward and reverse with each successive iteration over the sequence, storing one of the sets of state metrics from each window, and initialising the warm-up run of each window using a corresponding stored set of state metrics from a previous iteration.

BRIEF DESCRIPTION OF THE DRAWINGS

For a better understanding of the present invention and to show how it may be carried into effect, reference will now be made by way of example to the accompanying drawings in which.

DETAILED DESCRIPTION OF PREFERRED EMBODIMENTS

Figure 1:
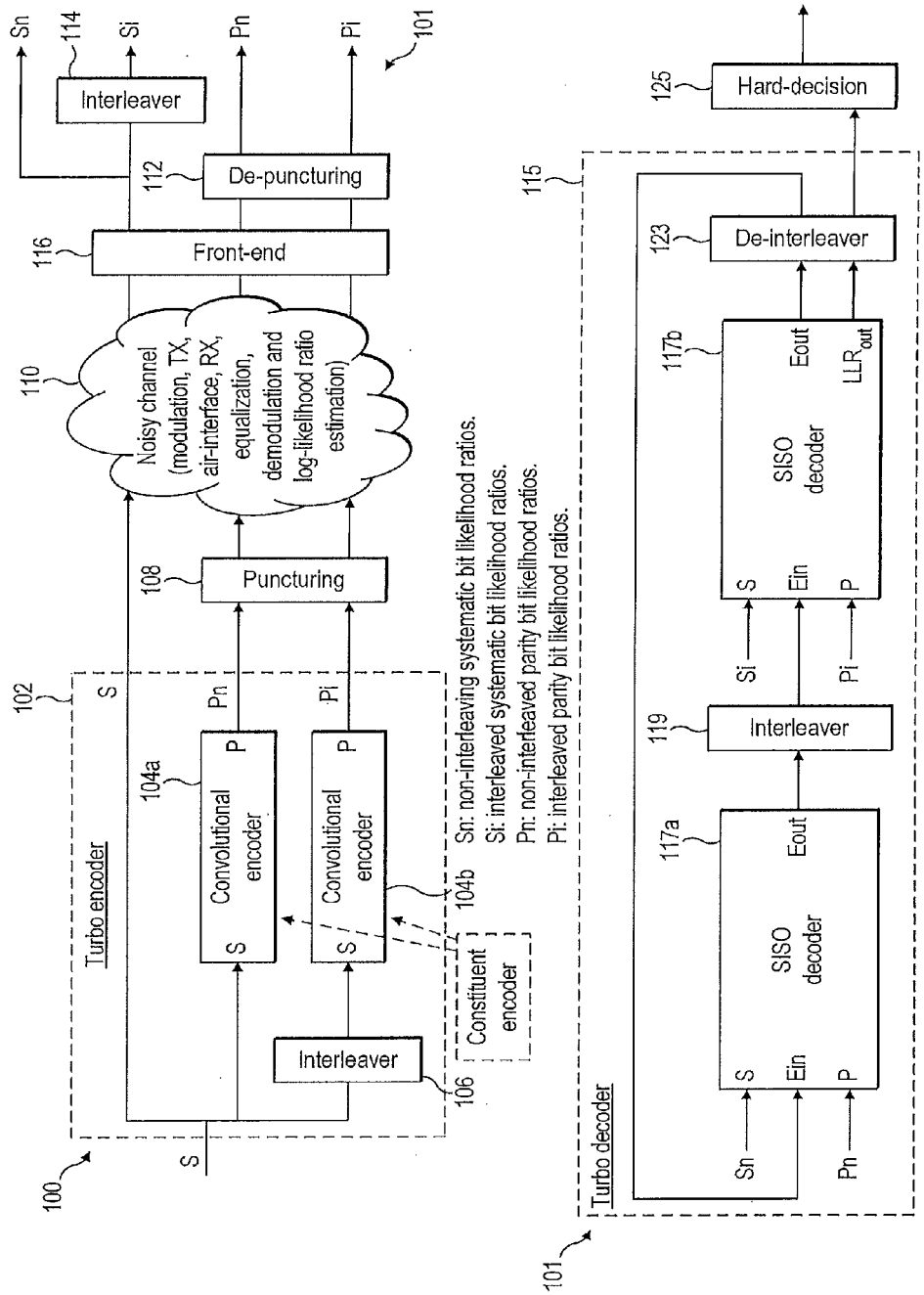
FIG. 1 is a schematic block diagram of an example of a Turbo encoding and decoding system.
Figure 2:
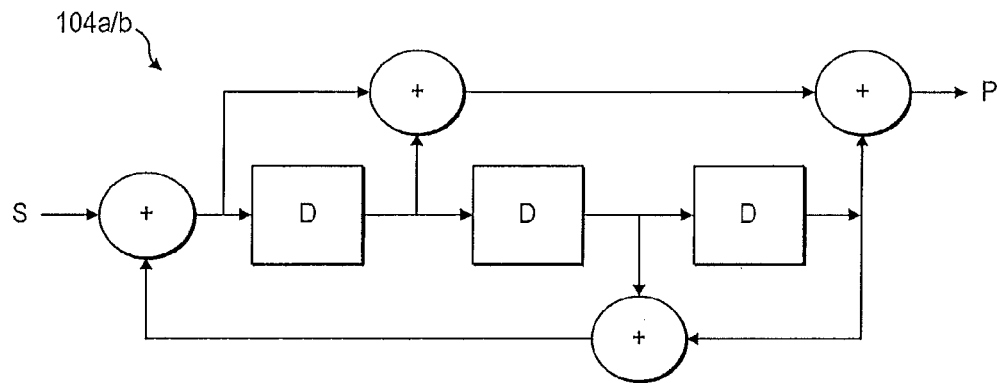
FIG. 2 is a schematic block diagram of a recursive systematic convolutional encoder, FIG. 3 schematically illustrates a block of forward and backwards trellis recursions for an 8-state convolutional code, FIG. 4 schematically illustrates a windowed Log-MAP decoding scheme.
Figure 2:
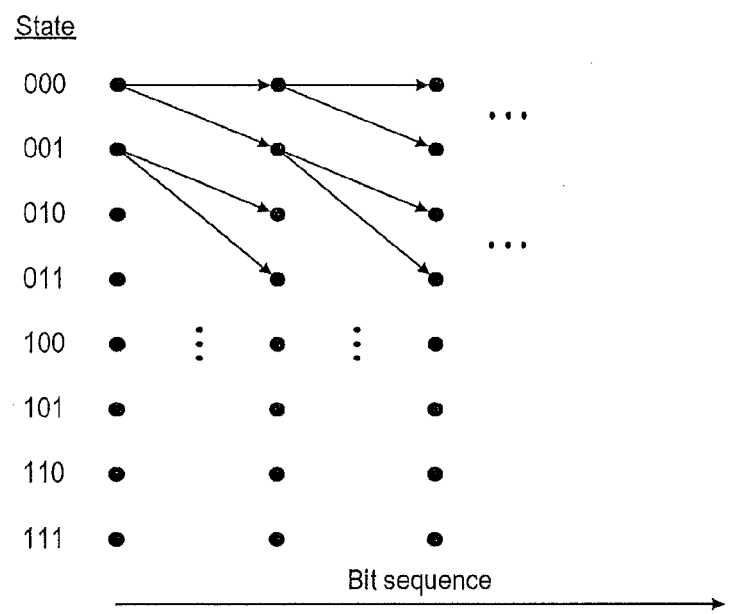
Figure 3:
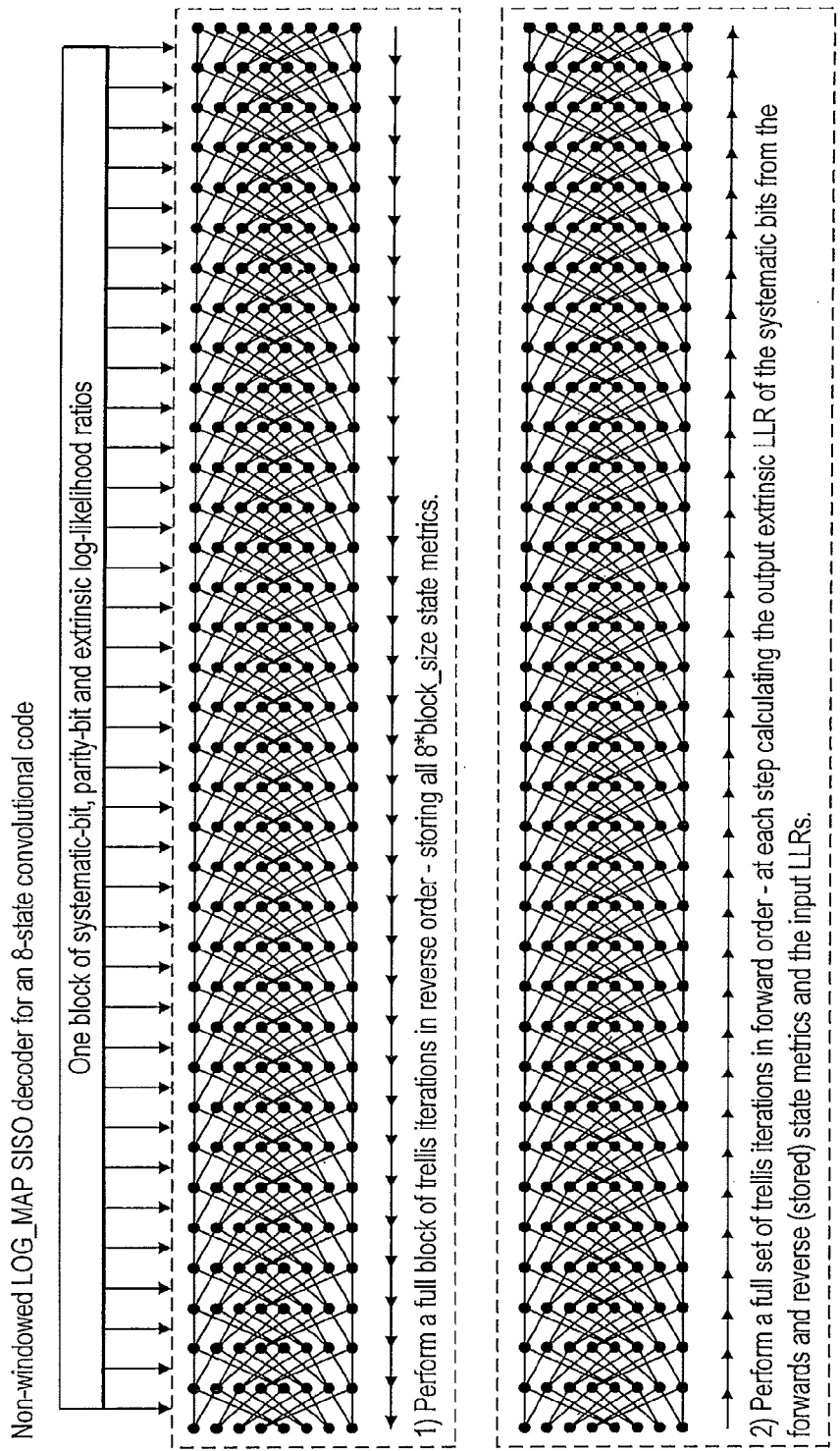
Figure 4:
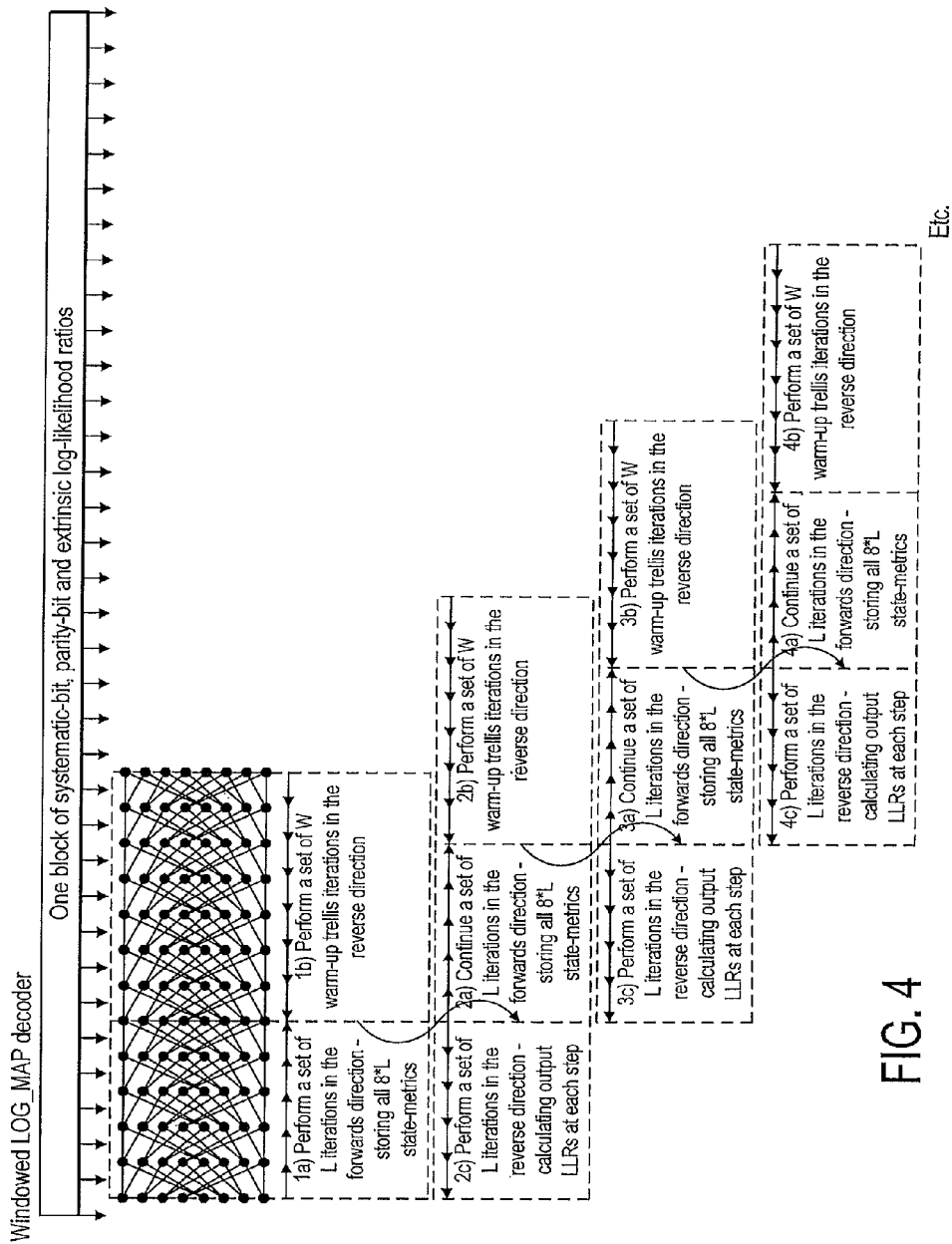

As mentioned, a set of warm-up recursions normally begins with all state-metrics set to the same value (all states equally likely) in the hope that after some modest number of recursions, the state-metrics will have converged to the same values that they would have taken had recursions started from a known initial state at one end of the block.

This can never happen if the parity bits are so heavily punctured that there are no un-punctured parity bits throughout the entire duration of a warm-up phase (the state-metrics will remain in their equal, initialized state throughout). In fact, in an 8-state trellis (corresponding to an encoder constraint length equal to 4), there must be at least 3 (encoder constraint length 1) un-punctured parity bits during the warm-up phase before it is possible for the state-metrics to diverge to the point where one state-metric is larger than any of the remaining 7.

It is partly for this reason that in order to achieve the same performance as an un-windowed MAP decoder, a windowed MAP decoder can require a much longer run of warm-up recursions when many parity bits are punctured.

This effect is exacerbated and can manifest itself at and around certain lower code rates if the remaining, un-punctured parity bits occur only at exact multiples of the impulse response period of the recursive constituent encoder. For example, the 3-bit recursive convolutional encoder used for turbo encoding in the 3GPP standard has an impulse response period of 7 (see References 3 and 7 above). When this pattern occurs; all of the remaining, un-punctured parity bit LLRs that the warm-up recursions encounter allow the state-metrics to diverge by only as much as a single un-punctured parity bit. Similarly, two interleaved sets of un-punctured parity bits, each with an exact periodicity of 7 would allow the warm-up recursions that encounter them to diverge the state-metrics by only as much as two un-punctured parity bits. In these particular cases, during any length of warm-up; there is never enough parity information to allow the state-metrics to diverge to the point where one state has a higher probability than any of the other 7. (Note that instead, an un-windowed MAP process that does not rely on warm-up recursions would at least have the benefit of starting from a known state at one end of the block.)

Although this problem could be avoided quite easily by varying the puncturing pattern slightly, it was not noticed until higher code rates began to be adopted and this pathological puncturing became an issue. This happened several years after the 3GPP standard had been first published and adopted by many parties. Thus, the 3GPP standard defines a simple puncturing algorithm that is unfortunately susceptible to this problem at all code rates R=7n/(7n+4) where 'n' is any positive integer. Under these conditions, the lowest code rate for which a windowed MAP decoder (with window size equal to several constraint lengths) could show a significant disadvantage over an un-windowed MAP decoder is around R=7/11.

Even an un-windowed MAP decoder can perform relatively poorly with these puncturing patterns at the above particular rates (slightly higher or slightly lower rates—with fewer or more parity bits—perform much better because the '1 in 7' pattern of un-punctured parity bits is broken). A windowed MAP decoder performs even more poorly since, close to these particular rates, the state-metrics can fail to converge if the pattern of un-punctured parity bits encountered during any warm-up phase has the aforementioned periodicity. If the warm-up phase duration is short, this can be the case for code rates that are merely close to, but not precisely 7n/(7n+4). Approaching these rates; performing much longer sets of warm-up recursions can allow a windowed MAP decoder to perform as well as an un-windowed MAP decoder. However, as mentioned before, lengthening the warm-up phase is costly.

Figure 5:
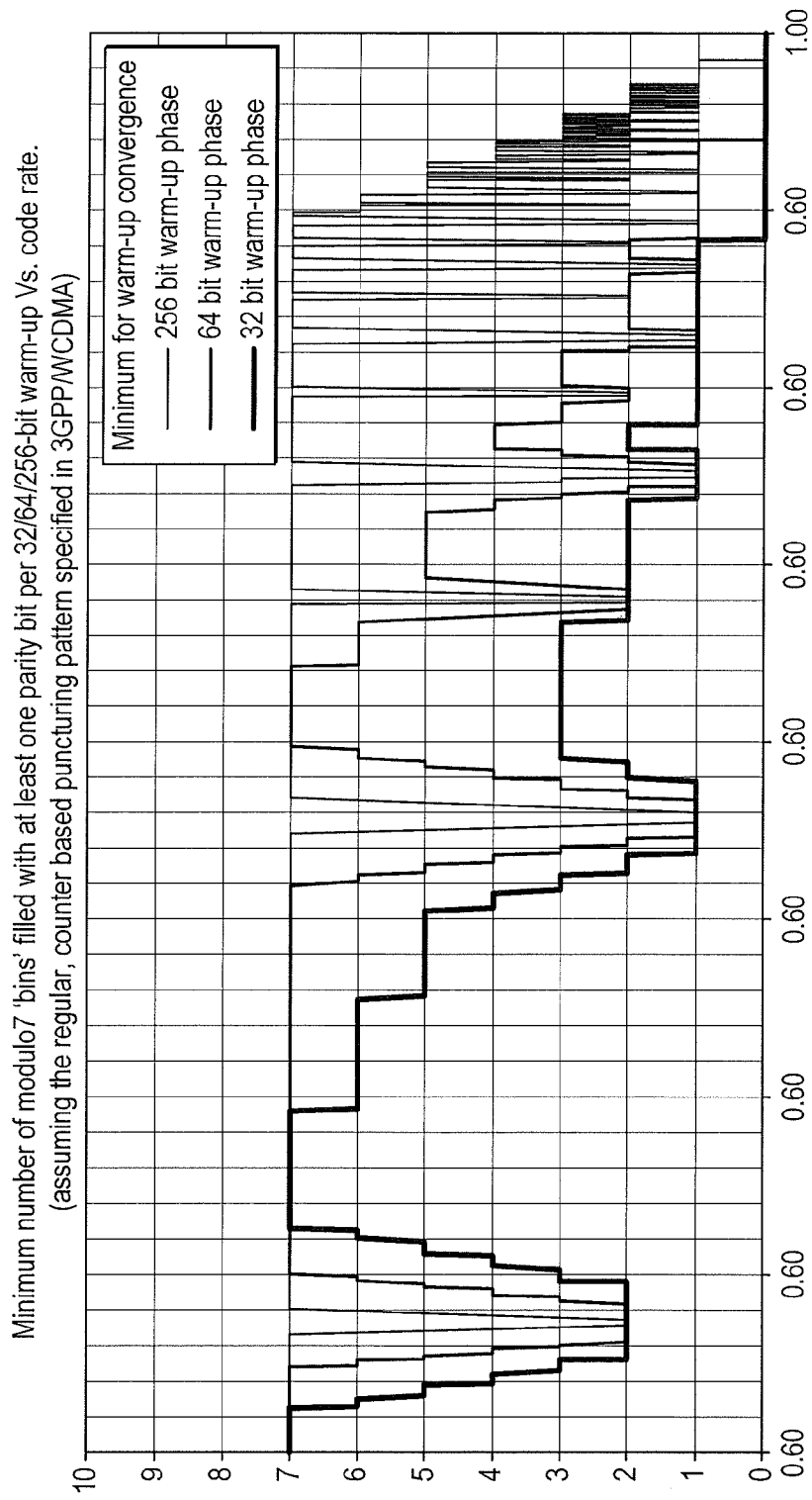
FIG. 5 is a graph showing coding rates which are problematic for certain window sizes.

FIG. 5 is a graph showing which rates are problematic for which window sizes by indicating whether the number of "effective" parity bits in any warm-up phase can be less than 3.

Letting W=warm-up length, R=code rate and P=2R/(1−R), the warm-up phase may not converge if:

dowed MAP or Log-MAP decoders to achieve almost the same error correcting performance as a completely un-windowed MAP or Log-MAP decoder. Thus, the economies of a windowed MAP or Log-MAP decoder can be accrued without any significant performance disadvantage. By way of illustration, the following refers to the use of a Log-MAP decoder, but the exposition is applicable to any other implementation of the MAP trellis processing for decoding of the turbo component codes, or indeed other windowed decoders.

In the preferred embodiments, the solution is to use a "snapshot" of a set of state-metrics stored during the decoding of a window in one Turbo decoder iteration in order to initialise a corresponding set of state-metrics at the start of a warm-up phase of the next Turbo decoder iteration.

Preferably, two modifications are made to the decoding process, as follows.

The first modification is to exchange, with each alternating Turbo decoder iteration, the direction in which warm-up recursions are performed with the direction in which continuous recursions are performed within the Log-MAP decoders. That is, in one Turbo decoder iteration the warm-up trellis recursions are performed in the reverse direction, whilst the block is decoded in windows starting with a window at the beginning of the block and working through window-by-window in order to the end of the block (so the direction of continuous recursions is forward). Then, in the subsequent Turbo decoder iteration, the warm-up trellis recursions are performed in the forward direction, whilst the block is decoded starting from the latest window in the block and working through window-by-window in order to the earliest window (so the direction of continuous recursions is in reverse). In the next Turbo decoder iteration after that, the directions are swapped back again, and so forth.

Secondly, a "snapshot" of one of the continuously generated sets of state-metrics is stored at regular intervals of one window. The snapshots are then used during the following Turbo iteration to initialize the state-metrics at the start of every set of warm-up recursions in the constituent Log-MAP decoders—this is possible only because the direction of the warm-up recursions has been swapped every second Turbo iteration for a given decoder. Only a small amount of memory is required to store the snapshots since they are taken just once per window length. The accuracy with which the state-metrics in these snapshots is stored can be reduced to minimize the required storage without greatly affecting performance.

This solution makes a Turbo decoder comprised of windowed Log-MAP decoders very nearly as effective as one comprised of completely un-windowed Log-MAP decoders, even when the Turbo code is punctured.

$$\text{MIN}\left(\text{MAX}\left(1, W \cdot \text{ABS}\left(\frac{7}{P}\left\lfloor\frac{P}{7}+\frac{1}{2}\right\rfloor-1\right)\right), 2 \cdot \text{MAX}\left(1, W \cdot \text{ABS}\left(\frac{7}{P}\left(\left\lfloor\frac{P}{7}\right\rfloor+\frac{1}{2}\right)-1\right)\right), \frac{W}{P}\right) < 3$$

So in summary, although the windowed MAP decoder has the great advantage of not requiring a large amount of temporary storage, it can perform poorly compared with an un-windowed decoder when puncturing is used to raise the code rate. For reasons just described, this is particularly true of the turbo encoder and puncturing algorithm defined in the 3GPP standard.

Preferred embodiments of the present invention solve this shortcoming for all code rates when the Log-MAP decoder is used as part of a Turbo decoder, without having to alter the length of the warm-up phase or the window size. The preferred embodiments allow a turbo decoder built using win- Preferably two types of windowed Log-MAP SISO decoder are used. One performs the aforementioned warming up (warm-up) in the reverse direction only and the other in the forwards direction only.

Figure 6:
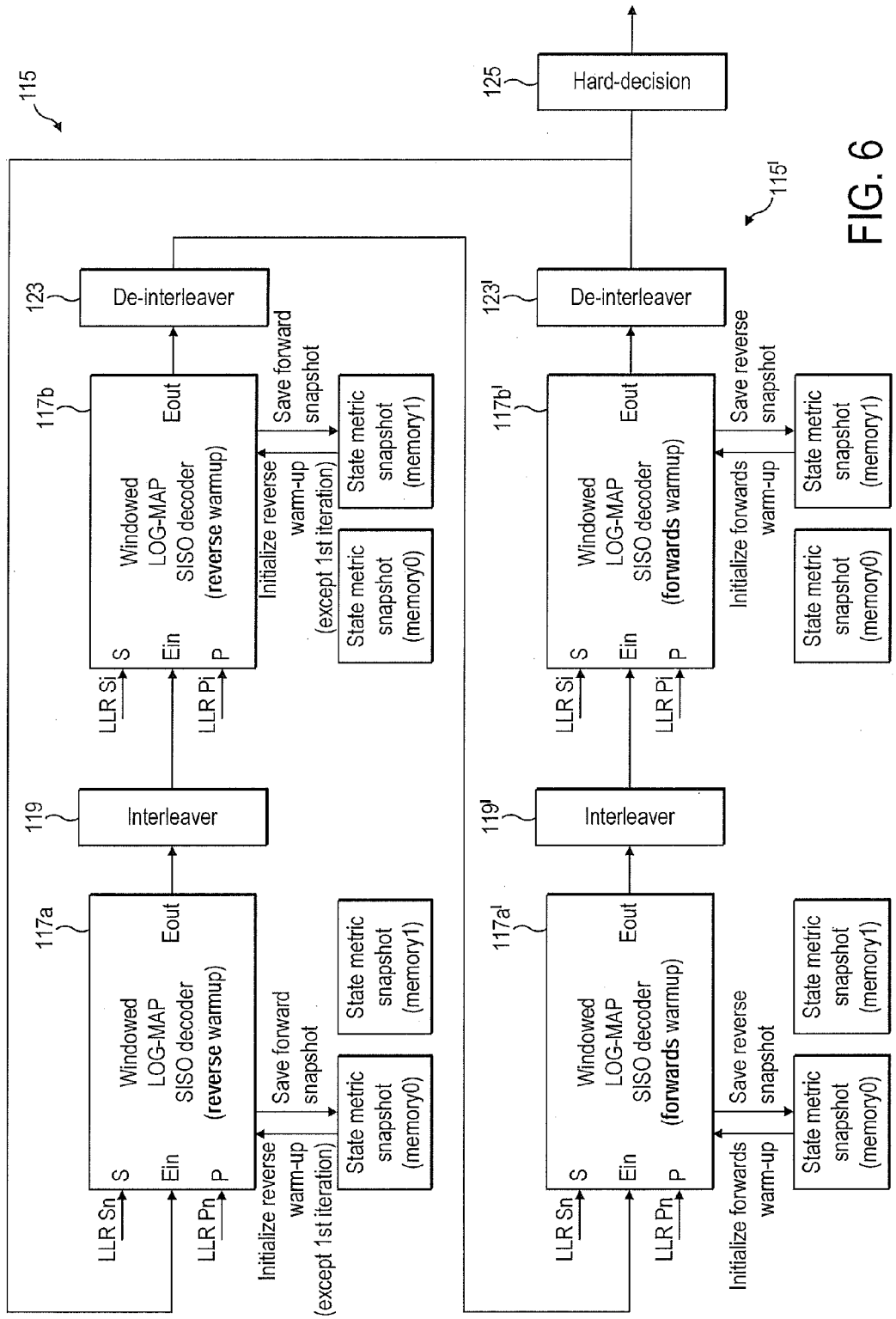
FIG. 6 is a schematic block diagram of an improved windowed Turbo decoder, FIG. 7 schematically illustrates an improved windowed Turbo decoding scheme.

FIG. 6 is a schematic block diagram of a modified Turbo decoder according to a preferred embodiment of the present invention. The Turbo decoder comprises a pair of decoders, a reverse warm-up decoder 115 and forward warm-up decoder 115'. The Turbo decoder further comprises a pair of snapshot memories labelled memory0 and memory1, and a hard decision module 125. The reverse warm-up decoder 115 comprises a respective first and second constituent SISO decoder 117a and 117b, a respective interleaver 119, and a respective de-interleaver 123. The forward warm-up decoder 115' comprises a respective first and second constituent SISO decoder 117a' and 117b', a respective interleaver 119', and a respective de-interleaver 123'. The constituent SISO decoders 117a, 117b, 117a' and 117b' are preferably windowed Log-MAP SISO decoders. So each is configured to divide a block of received symbols (and their corresponding sets of state metrics) into windows, and to decode each window separately by means of forward and reverse runs of trellis recursions.

Each of the pair of decoders 115 and 115' is similar to that described in relation to FIG. 1, but with the following modifications. The first constituent SISO decoder 117a and second constituent SISO decoder 117b of the reverse warm-up decoder 115 are each configured to work through decoding a block of received symbols window-by-window in the forward direction, but to perform warm-up recursions in the reverse direction of the block. The first constituent SISO decoder 117a' and second constituent SISO decoder 117b' of the forward warm-up decoder 115' are each configured to work through decoding a block of received symbols window-by-window in the reverse direction, but to perform warm-up recursions in the forwards direction of the block. This will be discussed in more detail in relation to FIG. 7.

Further, the input $E_{in}$ of the first SISO decoder 117a of the reverse warm-up decoder 115 is not coupled directly in a feedback loop with the output $E_{out}$ of the second SISO decoder 117b of the reverse warm-up decoder 115, but instead with the output $E_{out}$ of the forward warm-up decoder 115' (via its respective de-interleaver 123'). Accordingly, the output $E_{out}$ of the second SISO decoder 117b of the reverse warm-up decoder 115 is not coupled back directly in a feedback loop to the input $E_{in}$ of the first SISO decoder 117a of the reverse warm-up decoder 115, but instead to the input $E_{in}$ of the first SISO decoder 117a' of the forward warm-up decoder 115' (via the respective de-interleaver 123). The input $E_{in}$ of the first SISO decoder 117a' of the forward warm-up decoder 115' is not coupled directly in a feedback loop with the output $E_{out}$ of the second SISO decoder 117b' of the reverse warm-up decoder 115', but instead with the output $E_{out}$ of the reverse warm-up decoder 115 (via the respective the de-interleaver 123). The output $E_{out}$ of the second SISO decoder 117b' of the forward warm-up decoder 115' is not coupled back directly in a feedback loop to the input $E_{in}$ of the first SISO decoder 117a' of the forward warm-up decoder 115', but instead to the input $E_{in}$ of the first SISO decoder 117a of the reverse warm-up decoder 115 (via the respective de-interleaver 123').

Thus the overall Turbo decoder is configured to perform Turbo iterations alternately using the reverse and then the forward warm-up decoders 115 and 115' respectively.

An output ($LLR_{out}$) of the de-interleaver 123' of the forward warm-up decoder 115' is coupled to the input of the hard-decision module 125, which is arranged to supply the hard decision output once sufficient Turbo iterations from both the reverse and forward warm-up decoders 115 and 115' have been performed. Further, the first SISO decoder 117a of the reverse warm-up decoder 115 is coupled to the first state-metric snapshot memory (memory0), and the second SISO decoder 117b of the reverse warm-up decoder 115 is coupled to the second state-metric snapshot memory (memory1). The first SISO decoder 117a' of the forward warm-up decoder 115' is coupled to the first state-metric snapshot memory (memory0), and the second SISO decoder 117b' of the forward warm-up decoder 115' is coupled to the second state-metric snapshot memory (memory1). The SISO decoders are 117a, 117b, 117a' and 117b' are configured to operate in conjunction with the state-metric snapshot memories (memory0 and memory1) in order to capture, store and use snapshots of state-metrics in a manner discussed in more detail below.

Figure 7:
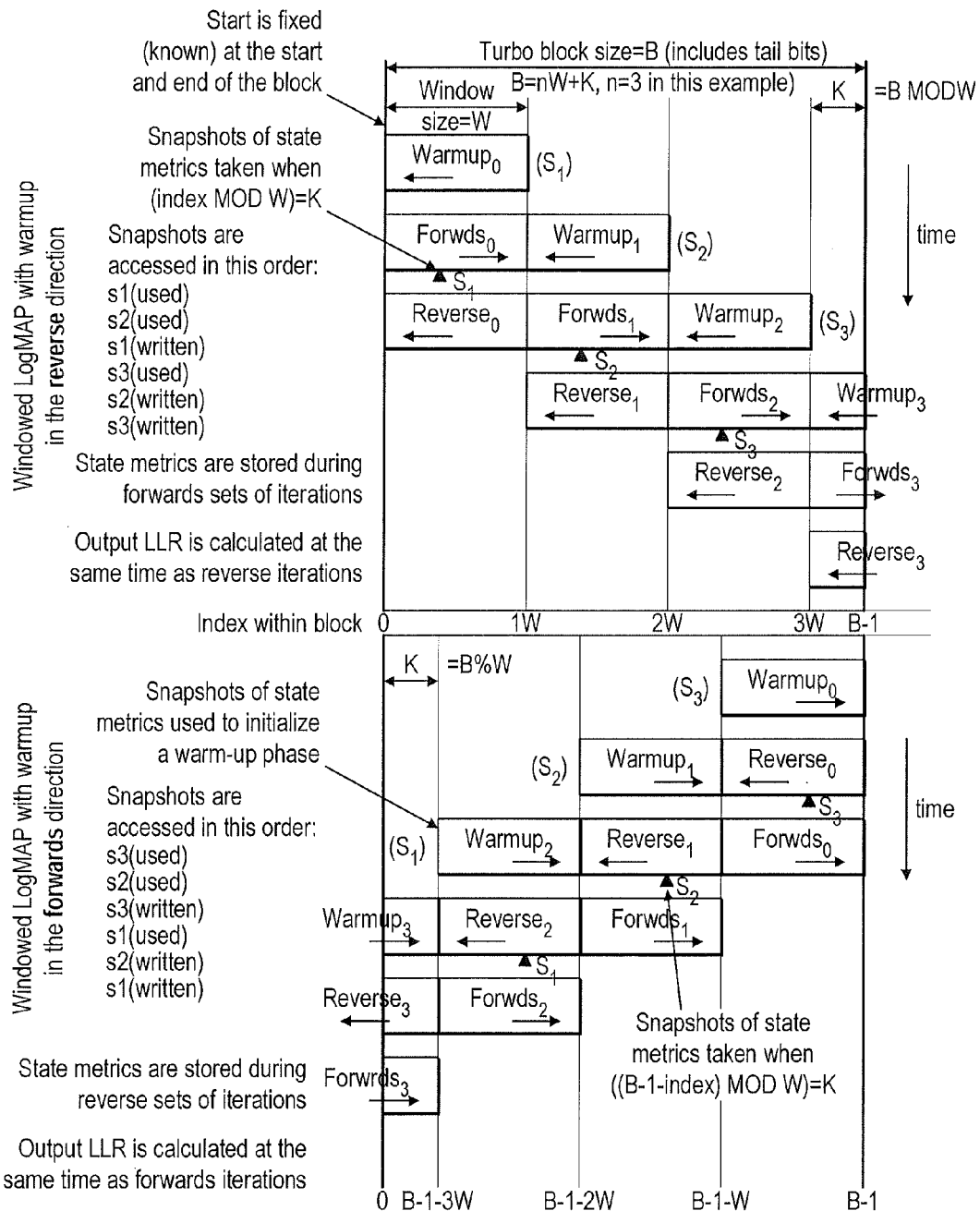

The process performed is illustrated schematically in FIG. 7.

The aforementioned "snapshots" of the state metrics that are taken every window length L are stored separately for SISO decodes of non-interleaved and interleaved data in memory0 and memory1 (illustrated) respectively.

A stored snapshot is used to initialize a warm-up phase at precisely the same point in the block as where it was originally taken.

Snapshots are used in precisely the opposite order to which they are stored (snapshots of the state metrics from continuous forward trellis recursions are used later to initialize reverse warm-up trellis recursions and vice-versa)

Referring to FIG. 7, by way of example the decoding of a block of size B symbols is illustrated, with each symbol and its corresponding set of state-metrics being identified by a respective index 0, 1, 2, ..., B-1 within the block. The block of length B symbols is divided into windows of length W and warm-up phases of length L. In this example W is equal to L but this need not necessarily be the case. The block is not necessarily an integer multiple of the window length W: there may be a remainder K such that K=B MOD W, where MOD indicates the modulus operation, with one of the windows being only of length K instead of the full length W (preferably an edge-most window). That is, generally B=nW+K where n is an integer. By way of illustration, n=3 in the example shown and discussed below (though in a more typical case n>>1).

The top half of FIG. 7 shows the decoding performed by the reverse warm-up decoder 115. The process is performed on both the non-interleaved and interleaved versions of the data, in the first and second constituent SISO decoders 117a and 117b respectively.

The process begins with a window of size W at the earliest location in the block. A reverse run of warm-up recursions ("warmup$_0$") is performed starting from index W-1 back to index 0. Unless this is the first Turbo iteration, the warm-up run "warmup$_0$" starts with a set of state-metrics initialised to be equal to a corresponding stored snapshot $s_1$ from the previous Turbo iteration (or if it is the first Turbo iteration then the state-metrics of that set start equally likely).

Note that s1 will be read from snapshot memory0 for the non-interleaved SISO decoder and from snapshot memory1 for the interleaved SISO decoder.

At a subsequent time, a forward run of trellis recursions ("forwds$_0$") is performed over the window from index 0 to index W-1. The updated sets of state-metrics determined in this forward run are stored in memory for further recursions by a reverse run ("reverse$_0$").

Note that in some embodiments this initial warm-up "warmup0" may not be considered relevant from the perspective of the present invention. The actual preferred decoder implementation does perform warmup0 because for 3GPP then "forwds0" should be initialised to the known zero state at the start of the block, but that is not essential in all embodiments.

During the forward run "forwrds$_0$" over window 0 to W-1, a snapshot $s_1$ is taken of one of the sets of state-metrics, and stored in the state-metric snapshot memory (the first snapshot memory0 for the non-interleaved iteration in the first SISO decoder 117a, and the second snapshot memory1 for the interleaved iteration in the second SISO decoder 117b). The position of the snapshot $s_1$ is the position where the distance into the window in the forward direction is equal to the remainder K (i.e. when index MOD W=K), which for $s_1$ is at K-1. This means the snapshot $s_1$ will be aligned with the start of a warm-up run in the next Turbo decoder iteration (see below).

A further warm-up run ("warmup$_1$") is also performed in the reverse direction from index 2W-1 to index W. Unless this is the first Turbo iteration, the warm-up run "warmup$_1$" starts with a set of state-metrics initialised to be equal to a corresponding stored snapshot $s_2$ from the previous Turbo iteration.

At a subsequent time, a reverse run of trellis recursions ("reverse$_0$") is performed over the window from index W-1 to index 0, beginning from the set of state-metrics from index W as determined by the adjacent reverse warm-up run "warmup$_1$". During this reverse run "reverse$_0$", output LLR values are calculated at the same time as each respective trellis recursion, for output to the next Turbo iteration.

A further forward run of trellis recursions ("forwrds$_1$") is also performed over the next window along, from index W to index 2W-1, beginning from the set of state-metrics from index W-1 as determined in the preceding adjacent forward run "forwrds$_0$". The updated sets of state-metrics determined in this forward run are stored in memory for further recursions by a reverse run ("reverse$_1$"). During the forward run "forwrds$_1$" over window W to 2W-1, another snapshot $s_2$ is taken of one of the sets of state-metrics, and stored in the relevant state-metric snapshot memory (memory0 for the non-interleaved iteration and memory1 for the interleaved iteration). The position of this next snapshot $s_2$ is again the position where the distance into the window in the forward direction is equal to the remainder K (i.e. when index MOD W=K), which for $s_2$ is at W+K-1. This means the snapshot $s_2$ will be aligned with the start of a corresponding warm-up run in the next Turbo decoder iteration (see below).

Further, yet another warm-up run ("warmup$_2$") is performed in the reverse direction from index 3W-1 back to index 2W. Unless this is the first Turbo iteration, the warm-up run "warmup$_2$" starts with a set of state-metrics initialised to be equal to a corresponding stored snapshot $s_3$ from the previous Turbo iteration.

At a subsequent time, a reverse run of trellis recursions ("reverse$_1$") is performed over the window from index 2W-1 to index W, beginning from the set of state-metrics from index 2W as determined by the adjacent reverse warm-up run "warmup$_2$". During this reverse run "reverse$_1$", output LLR values are calculated at the same time as each respective trellis recursion, for output to the next Turbo iteration.

A further forward run of trellis recursions ("forwrds$_2$") is also performed over the next window along, from index 2W to index 3W-1, beginning from the set of state-metrics from index 2W-1 as determined in the preceding adjacent forward run "forwrds$_1$". The updated sets of state-metrics determined in this forward run are stored in memory for further recursions by a reverse run ("reverse$_2$"). During the forward run "forwrds$_2$" over window 2W to 3W-1, another snapshot $s_3$ is taken of one of the sets of state-metrics, and stored in the relevant state-metric snapshot memory (memory0 for the non-interleaved iteration and memory1 for the interleaved iteration). The position of this next snapshot $s_3$ is again the position where the distance into the window in the forward direction is equal to the remainder K (i.e. when index MOD W=K), which for $s_3$ is at 2W+K-1. This means the snapshot $s_3$ will be aligned with the start of a corresponding warm-up run in the next Turbo decoder iteration (see below).

Also, yet another warm-up run ("warmup$_3$") is performed in the reverse direction from index B-1 back to index 3W (so this is a shorter run over the remainder K of the block after the largest possible integer number n of windows W have been covered in the block). A snapshot may not be required for this warm up.

Note that it is a property of the turbo code used for 3GPP that the encoder begins and ends the block in the zero state, so here "warmup3" would be initialised to the known zero state at index B-1. However, other turbo codes use tail-biting or circulating trellises where it may be useful to initialise this run from a snapshot.

At a subsequent time, another reverse run of trellis recursions ("reverse$_2$") is performed over the window from index 3W-1 to index 2W, beginning from the set of state-metrics from index 3W as determined by the adjacent reverse warm-up run "warmup$_3$". During this reverse run "reverse$_2$", output LLR values are calculated at the same time as each respective trellis recursion, for output to the next Turbo iteration.

A further forward run of trellis recursions ("forwrds$_3$") is also performed over the next window along, from index 3W to index B-1, beginning from the set of state-metrics from index 3W-1 as determined in the preceding adjacent forward run "forwrds$_2$". So this last forward run "forwrds$_3$" covers the last remainder K at the end of the block B. The updated sets of state-metrics determined in this forward run are stored in memory for further recursions by a reverse run ("reverse$_3$"). No snapshot need be taken in this last forwards run "forwrds$_3$".

Finally, at a further subsequent time, a last reverse run of trellis recursions ("reverse$_3$") is performed over the window from index B-1 to index 3W. During this reverse run "reverse$_3$", output LLR values are calculated at the same time as each respective trellis recursion, for output to the next Turbo iteration. For 3GPP the "reverse3" run should be initialised to the known zero state at index B-1.

Thus to summaries the operation of the reverse warm-up decoder 115, the block of symbols is decoded window-by-window starting from the beginning of the block and working forwards, with the remainder K being located at the end of the block. This means forwards is the direction of continuous recursions. In other words, forward runs in each subsequent window can begin from the state metrics of the preceding window, but reverse runs on the other hand require warm-up runs because of the discontinuous position of consecutive runs of trellis recursions in that direction (e.g. running back from index W-1 to 0, then jumping up to 2W-1 then running back to W, etc.). The state-metrics are stored during forward runs of recursions, and the output LLR values are calculated at the same time as the reverse recursions. Snapshots are taken and stored during forward runs on the way forwards through the block, and warm-ups are performed in the reverse direction.

The snapshots are accessed in the following order:
- $s_1$ from the previous Turbo iteration is used to initialise warmup$_0$ in the current Turbo iteration
- $s_2$ from the previous Turbo iteration is used to initialise warmup$_1$ in the current Turbo iteration
- $s_1$ is written during forwrds$_0$ in the current Turbo iteration for use in the next Turbo iteration
- $s_3$ from the previous Turbo iteration is used to initialise warmup$_2$ in the current Turbo iteration
- $s_2$ is written during forwrds$_1$ in the current Turbo iteration for use in the next Turbo iteration
- $s_3$ is written during forwrds$_2$ in the current Turbo iteration for use in the next Turbo iteration Snapshots are read from snapshot memory0 for the non-interleaved SISO decoder and from snapshot memory1 for the interleaved SISO decoder.

The bottom half of FIG. 7 shows the decoding performed by the forward warm-up decoder 115'. The process is performed on both the non-interleaved and interleaved versions of the data, in the first and second constituent SISO decoders 117a' and 117b' respectively.

This time the process begins with a window of size W at the latest location in the block of size B. A forward run of warm-up recursions ("warmup$_0$") is performed starting from index B-W forward to index B-1. Unless this is the first Turbo iteration, the warm-up run "warmup$_0$" starts with a set of state-metrics initialised to be equal to the corresponding stored snapshot s$_3$ from the previous Turbo iteration. Thus note that the remainder K is not handled at the end of the block like in the reverse warm-up decoder 115, so the windows of the forward warm-up decoder 115' are not aligned with the windows of the reverse warm-up decoder 115. However, because of the way the position of the snapshots is determined, this means the snapshots from the previous Turbo iteration are each aligned with the beginning of a corresponding one of the warm-up phases of the next Turbo iteration, allowing the start of the warm-up run of recursions to be initialised by putting the starting set of state metrics equal to the snapshot. This works for all the snapshots and their corresponding windows, and for both the alternation from the reverse to the forward warm-up decoder 115 to 115' and vice versa from the forward to the reverse warm-up decoder 115' to 115.

At a subsequent time, a reverse run of trellis recursions ("reverse$_0$") is performed over the window from index B-1 to index B-1-W. The updated sets of state-metrics determined in this reverse run are stored in memory for further recursions by a forward run ("forwrds$_0$").

During the reverse run "reverse$_0$" over window B-1 to B-W, a snapshot s$_3$ is taken of one of the sets of state-metrics, and stored in the state-metric snapshot memory (the first snapshot memory0 for the non-interleaved iteration in the first SISO decoder 117a', and the second snapshot memory1 for the interleaved iteration in the second SISO decoder 117b'). The position of the snapshot s$_3$ is the position where the distance backwards into the window in the reverse direction is equal to the remainder K (i.e. when (B-1-index) MOD W=K), which for s$_3$ is at B-1-K. As discussed above, this means the snapshot s$_3$ will be aligned with the start of the reverse warm-up run "warmup$_2$" in the next Turbo decoder iteration.

A further warm-up run ("warmup$_1$") is also performed in the forward direction from index B-2W to index B-1-W. The warm-up run "warmup$_1$" starts with a set of state-metrics initialised to be equal to the corresponding stored snapshot s$_2$ from the previous Turbo iteration.

At a subsequent time, a forward run of trellis recursions ("forward$_0$") is performed over the window from index B-W to index B-1, beginning from the set of state-metrics from index B-1-W as determined by the adjacent preceding forward warm-up run "warmup$_1$". During this forward run "forward$_0$", output LLR values are calculated at the same time as each respective trellis recursion, for output to the next Turbo iteration or hard-decision module 125.

A further reverse run of trellis recursions ("reverse$_1$") is also performed over the next window back, from index B-1-W to index B-2W, beginning from the set of state-metrics from index B-W as determined in the adjacent reverse run "reverse$_0$". The updated sets of state-metrics determined in this reverse run are stored in memory for further recursions by a forward run ("forwrds$_1$"). During the reverse run "reverse$_1$" over window B-1-W back to B-2W, another snapshot s$_2$ is taken of one of the sets of state-metrics, and stored in the relevant state-metric snapshot memory (memory0 for the non-interleaved iteration and memory1 for the interleaved iteration). The position of this next snapshot s$_2$ is again the position where the distance back into the window in the reverse direction is equal to the remainder K (i.e. when (B-1-index) MOD W=K), which for s$_2$ is at B-1-K-W. This means the snapshot s$_2$ will be aligned with the start of the corresponding reverse warm-up run "warm-up$_1$" in the next Turbo decoder iteration.

Further, yet another warm-up run ("warmup$_2$") is performed in the forward direction from index B-3W to index B-1-2W. The warm-up run "warmup$_2$" starts with a set of state-metrics initialised to be equal to a corresponding stored snapshot s1 from the previous Turbo iteration.

At a subsequent time, a forward run of trellis recursions ("forwrds$_1$") is performed over the window from index B-2W to index B-1-W, beginning from the set of state-metrics from index B-1-2W as determined by the adjacent preceding forward warm-up run "warmup$_2$". During this forward run "forwrds$_1$", output LLR values are calculated at the same time as each respective trellis recursion, for output to the next Turbo iteration or hard-decision module 125.

A further reverse run of trellis recursions ("reverse$_2$") is also performed over the next window back, from index B-1-2W back to B-3W, beginning from the set of state-metrics from index B-2W as determined in the adjacent reverse run "reverse$_1$". The updated sets of state-metrics determined in this reverse run are stored in memory for further recursions by a forward run ("forwrds$_2$"). During the reverse run "reverse$_2$" over window B-1-2W back to B-3W, another snapshot s$_1$ is taken of one of the sets of state-metrics, and stored in the relevant state-metric snapshot memory (memory0 for the non-interleaved iteration and memory1 for the interleaved iteration). The position of this next snapshot s$_1$ is again the position where the distance back into the window in the reverse direction is equal to the remainder K (i.e. when (B-1-index) MOD W=K), which for s$_1$ is at B-1-K-2W. This means the snapshot s$_3$ will be aligned with the start of a corresponding warm-up run in the next Turbo decoder iteration.

Also, yet another warm-up run ("warmup$_3$") is performed in the forward direction from index 0 up to index B-1-3W (so this is a shorter run over the remainder K of the block after the largest possible integer number n of windows W have been covered backwards from the end the block). A snapshot may not be required for this warm up. Again for 3GPP, "warmup$_3$" should be initialised to the known zero state at index B-1.

At a subsequent time, another forward run of trellis recursions ("forwrds$_2$") is performed over the window from index B-3W to index B-1-2W, beginning from the set of state-metrics from index B-1-3W as determined by the preceding adjacent forward warm-up run "warmup$_3$". During this forward run "forwrd$_2$", output LLR values are calculated at the same time as each respective trellis recursion, for output to the next Turbo iteration or hard-decision module 125.

A further reverse run of trellis recursions ("reverse$_3$") is also performed over the next window back, from index B-1-3W back to index 0, beginning from the set of state-metrics from index B-3W as determined in the adjacent reverse run "reverse$_2$". So this last reverse run "reverse$_3$" covers the final remainder K at the beginning of the block B. The updated sets of state-metrics determined in this reverse run are stored in memory for further recursions by a forward run ("forwrds$_3$"). No snapshot need be taken in this last forwards run "reverse$_3$".

Finally, at a further subsequent time, a last forward run of trellis recursions ("forwrds$_3$") is performed over the window from index 0 to index B-1-3W. During this forward run "forwrds$_3$", output LLR values are calculated at the same time as each respective trellis recursion, for output to the next Turbo iteration.

Thus to summarise the operation of the forward warm-up decoder 115', the block of symbols is decoded window-by-window starting from the end of the block and working backwards, with the remainder K at the beginning of the block. This means reverse is the direction of continuous recursions. In other words, in this case the reverse runs in each subsequent window back can begin from the state metrics of the adjacent window further forward in the block, but the forward runs on the other hand require warm-up runs because of the discontinuous position of consecutive runs of trellis recursions (e.g. running forward from index B-W to B-1, then jumping back to B-2W then running up to B-1-W, etc.). The state-metrics are stored during reverse sets of recursions, and output LLR values are calculated at the same time as the forward recursions. Snapshots are taken and stored during reverse runs on the way backwards through the block, and warm-ups are performed in the forward direction.

Figure 8:
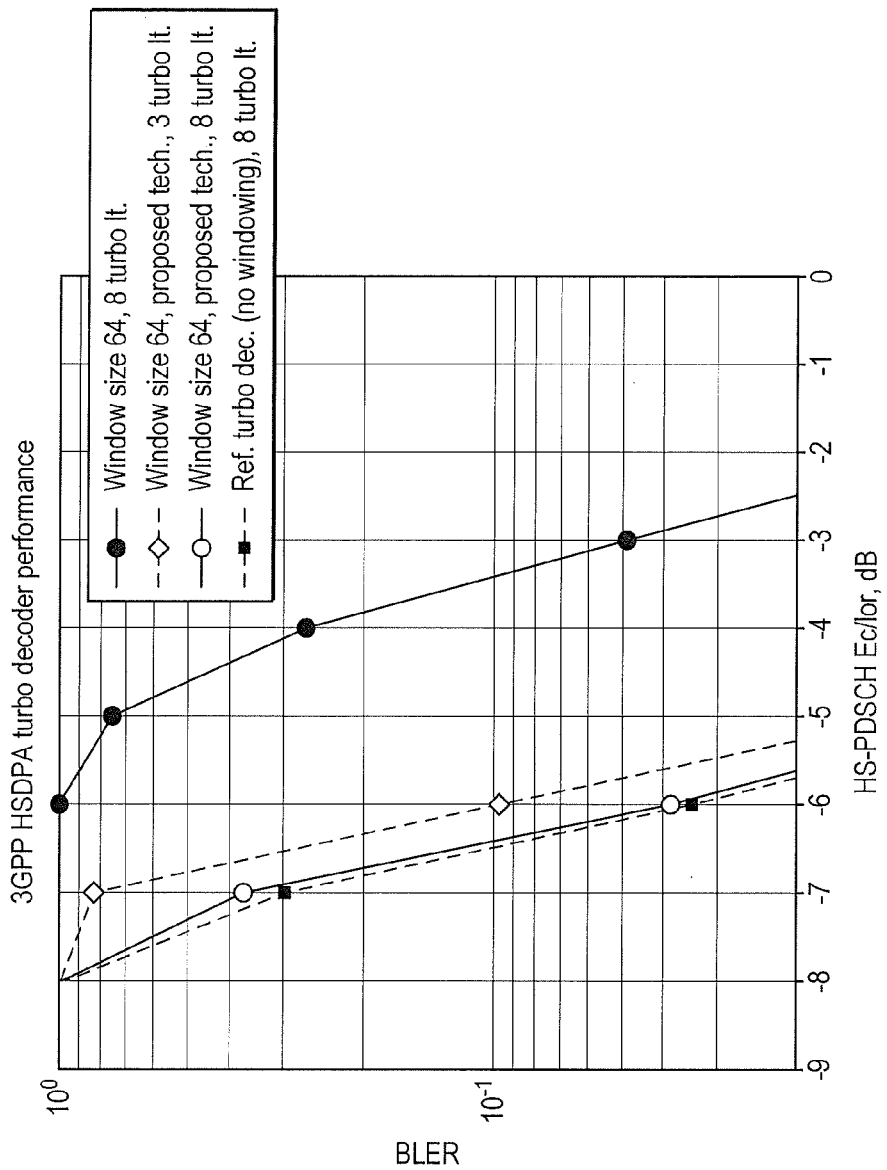
FIG. 8 is an example BLER curve showing simulated performance for an embodiment of the present invention.

The snapshots are accessed in the following order:
$s_3$ from the previous Turbo iteration is used to initialise warmup$_0$ in the current Turbo iteration
$s_2$ from the previous Turbo iteration is used to initialise warmup$_1$ in the current Turbo iteration
$s_3$ is written during reverse$_0$ in the current Turbo iteration for use in the next Turbo iteration
$s_1$ from the previous Turbo iteration is used to initialise warmup$_2$ in the current Turbo iteration
$s_2$ is written during reverse$_1$ in the current Turbo iteration for use in the next Turbo iteration
$s_1$ is written during reverse$_2$ in the current Turbo iteration for use in the next Turbo iteration FIG. 8 is a block error rate (BLER) curve, showing an example performance according to simulations of embodiments of the present invention (labelled "Proposed Tech") for an HSDPA UE for a case with very high puncturing of the rate ⅓ turbo code (for reference the left-most curve shows an un-windowed decoding and the right-most curve shows a windowed decoding without the present invention applied).

The present invention has a preferred application in a soft modem. In that case, each of the components 115, 115' and 125 is preferably implemented in software stored on a memory and executed on a processor. The memory and processor may be embodied in any receiver, e.g. a user equipment or base station (node-B). However, solutions where some or all of the components are implemented in dedicated hardware are not excluded.

It will be appreciated that the above embodiments have been described only by way of example. The sequence of processing blocks described in the preferred embodiment may be altered in any way that would still allow the availability of state information for a suitable initialization of the state metrics at the beginning of each warm-up window in the next Turbo iteration or such like. The present invention is not limited to use in a Turbo decoder or MAP decoders defined according to any particular standard, but more generally the principle of the invention can apply to any windowed decoder that uses forward and reverse runs of recursions over sequences of state-metrics. Further, the invention is not specific to 3GPP standards or any other particular wireless communication standards, but more generally can apply to any kind of transmission over a noisy channel. Other applications and configurations will be apparent to a person skilled in the art given the disclosure herein. The present invention is not limited by the described embodiments, but only by the appended claims.

The invention claimed is:

1. A method comprising:
receiving a signal comprising a sequence of encoded symbols, each corresponding to one of a plurality of possible states;
for each symbol in the sequence, determining a set of state metrics each representing a probability that the symbol corresponds to each of said plurality of states; and
decoding the signal by processing runs of recursions, using runs of forward recursions whereby a later state metric in the sequence is updated based on a preceding state metric, and runs of reverse recursions whereby a preceding state metric in the sequence is updated based on a later state metric; and
outputting the decoded signal to a device;
wherein the decoding comprises performing a plurality of repeated iterations over the sequence, and for each of said plurality of repeated iterations:
dividing the sequence into a plurality of smaller windows,
processing the windows using both a forward and reversion run of recursions, and
performing an associated warm-up run of recursions for each window such that the direction in which the runs of recursions between adjacent windows are continuous alternates with each successive iteration over the sequence, and is opposite to the direction of the warm-up recursions; and
wherein the decoding further comprises, for each repeated recursion:
alternating the direction of the warm-up runs between forward and reverse with each successive iteration over the sequence,
storing one of the sets of state metrics from each window, and
initialising the warm-up run of each window using a corresponding stored set of state metrics from a previous iteration.

2. The method of claim 1, wherein the sequence of received encoded symbols comprises a variable amount of unavailable redundant information, and the method comprises re-introducing bits in place of the unavailable redundant information.

3. The method of claim 1, wherein the decoding further comprises alternating a direction of processing each successive iteration over the sequence, so as in one direction to process the sequence window-by-window from start to end of the sequence, and in the other direction to process the sequence window-by-window from end to start.

4. The method of claim 3, wherein:
all but the final window of the iteration are of a same window length, and the sequence comprises a block of a length that is not integer multiple of said window length, leaving a final window having a smaller remainder number of symbols; and
the stored set of state metrics from each window are taken from a position within each window equal to the remainder number of symbols into that window in the direction of processing the iteration.

5. The method of claim 1, wherein the signal is received over a wireless channel.

6. The method of claim 1, wherein each of said iterations is a Turbo iteration, and each of said recursions is a trellis iteration.

7. The method of claim 1, wherein the decoding is by maximum a posteriori probability decoding.

8. An apparatus comprising:
a receiver arranged to receive a signal comprising a sequence of encoded symbols, each corresponding to one of a plurality of possible states; and
a decoder configured to determine, for each symbol in the sequence, a set of state metrics each representing a probability that the symbol corresponds to each of said plurality of states;
wherein the decoder is configured to decode the signal by processing runs of recursions, using runs of forward recursions whereby a later state metric in the sequence is updated based on a preceding state metric, and runs of reverse recursions whereby a preceding state metric in the sequence is updated based on a later state metric; and
outputting the decoded signal to a device;
wherein the decoder is configured to perform a plurality of repeated iterations over the sequence, and for each of said plurality of repeated iterations:
divide the sequence into a plurality of smaller windows,
process the windows using both a forward and reversion run separate runs of recursions, and
perform an associated warm-up run of recursions for each window such that the direction in which the runs of recursions between adjacent windows are continuous alternates with each successive iteration over the sequence, and is opposite to the direction of the warm-up recursions; and
wherein the decoder is further configured to, for each repeated iteration:
alternate the direction of the warm-up runs between forward and reverse with each successive iteration over the sequence,
store one of the sets of state metrics from each window, and
initialise the warm-up run of each window using a corresponding stored set of state metrics from a previous iteration.

9. The apparatus of claim 8, wherein the sequence of received encoded symbols comprises a variable amount of unavailable redundant information, and the method comprises re-introducing bits in place of the unavailable redundant information.

10. The apparatus of claim 8, wherein the decoder is further configured to alternate a direction of processing each successive iteration over the sequence, so as in one direction to process the sequence window-by-window from start to end of the sequence, and in the other direction to process the sequence window-by-window from end to start.

11. The apparatus of claim 10, wherein:
all but the final window of the iteration are of a same window length, and the sequence comprises a block of a length that is not integer multiple of said window length, leaving a final window having a smaller remainder number of symbols; and the decoder is configured to take the stored set of state metrics from a position within each window equal to the remainder number of symbols into that window in the direction of processing the iteration.

12. The apparatus of claim 8, wherein the receiver is arranged to receive the signal over a wireless channel.

13. The apparatus of claim 8, wherein the decoder is a Turbo decoder comprising a plurality of constituent trellis decoders, such that each of said iterations is a Turbo iteration and each of said recursions is a trellis iteration.

14. The apparatus of claim 8, wherein the decoder is a maximum a posteriori probability decoder.

15. A computer program product comprising code embodied on a non-transitory computer-readable medium and configured so as when executed on a processor to:
receive a signal comprising a sequence of encoded symbols, each corresponding to one of a plurality of possible states;
for each symbol in the sequence, determine a set of state metrics each representing a probability that the symbol corresponds to each of said plurality of states;
decode the signal by processing runs of recursions, using runs of forward recursions whereby a later state metric in the sequence is updated based on a preceding state metric, and runs of reverse recursions whereby a preceding state metric in the sequence is updated based on a later state metric; and
outputting the decoded signal to a device;
wherein the decoding comprises performing a plurality of repeated iterations over the sequence, and for each of said plurality of repeated iterations:
dividing the sequence into a plurality of smaller windows,
processing the windows using both a forward and reversion run separate runs of recursions, and
performing an associated warm-up run of recursions for each window such that the direction in which the runs of recursions between adjacent windows are continuous alternates with each successive iteration over the sequence, and is opposite to the direction of the warm-up recursions; and
wherein the decoding further comprises, for each repeated iteration:
alternating the direction of the warm-up runs between forward and reverse with each successive iteration over the sequence,
storing one of the sets of state metrics from each window, and
initialising the warm-up run of each window using a corresponding stored set of state metrics from a previous iteration.

16. A computer program product comprising code embodied on a non-transitory computer-readable medium and configured so as when executed on a processor to perform the steps of claim 1.

* * * * *